United States Patent [19]

An et al.

[11] Patent Number: 5,234,854
[45] Date of Patent: Aug. 10, 1993

[54] METHOD FOR MANUFACTURING SEMICONDUCTOR DEVICE

[75] Inventors: Tae-hyeok An, Suwon; Seong-tae Kim; Kyung-hun Kim, both of Seoul, all of Rep. of Korea

[73] Assignee: Samsung Electronics Co., Ltd., Kyunggi, Rep. of Korea

[21] Appl. No.: 592,803

[22] Filed: Oct. 4, 1990

[30] Foreign Application Priority Data

Aug. 7, 1990 [KR] Rep. of Korea ............. 90-12098

[51] Int. Cl.⁵ ........................................... H01L 21/285
[52] U.S. Cl. ........................................... 437/47; 437/52; 437/60; 437/203; 437/233; 437/919
[58] Field of Search ............... 357/23.6; 437/203, 52, 437/233, 919, 228, 47, 60

[56] References Cited

U.S. PATENT DOCUMENTS

| | | | |
|---|---|---|---|
| 4,794,563 | 12/1988 | Maeda | 357/23.6 |
| 4,885,262 | 12/1989 | Ting et al. | 437/47 |
| 4,944,682 | 7/1990 | Cronin et al. | 437/228 |
| 4,951,175 | 8/1990 | Kurosawa et al. | 437/47 |
| 4,966,870 | 10/1990 | Barber et al. | 437/228 |
| 4,990,463 | 2/1991 | Mori | 437/919 |
| 5,066,608 | 11/1991 | Kim et al. | 437/52 |
| 5,077,232 | 12/1991 | Kim et al. | 437/47 |

*Primary Examiner*—Olik Chaudhuri
*Assistant Examiner*—Ourmazd S. Ojan
*Attorney, Agent, or Firm*—Cushman, Darby & Cushman

[57] ABSTRACT

A method for manufacturing a semiconductor device including a combined stack-trench type capacitor is disclosed. The method comprises the steps of: forming a conductive layer serving as a first electrode of the capacitor both on the inside region of a trench and on a transistor and forming a planarizing layer on the conductive layer; forming a photoresist pattern on the planarizing layer; etching the planarizing layer and the conductive layer; and removing the planarizing layer. The sandwiched planarizing layer between the second conductive layer and the photoresist pattern prevents the exposing of the first electrode pattern during the photoetching, so that uncontaminated uniform dielectric film can be obtained.

6 Claims, 3 Drawing Sheets

METHOD FOR MANUFACTURING SEMICONDUCTOR DEVICE

FIELD OF THE INVENTION

The present invention relates to a method for manufacturing a semiconductor device, and particularly to a method for manufacturing a semiconductor device in which the occurrence of defects during the manufacturing processes for a capacitor of a memory device can be minimized.

BACKGROUND OF THE INVENTION

Recently, progress has been made in the development of large capacity memory devices along with progress in manufacturing methods for semiconductor devices and increased applications in the field of memory devices. Especially by forming an individual memory cell having a single capacitor and a single transistor, considerable progress is being achieved in DRAM (Dynamic Random Access Memory) which is favorable to increase packing density.

In order to increase the packing density, the DRAM has been developed from a conventional planar-type capacitor cell structure to a three-dimensional structure, which is typically divided into two types, stack-type or trench-type, according to the memory cell structure.

In the trench-type capacitor, the widened inside walls of a trench formed by anisotropic-etching of a silicon substrate are utilized as a capacitor region, whereby sufficient capacitance can be available within a narrow region. This type of capacitor is more advantageous in planarization than that of a stack-type capacitor which will be described below. However, minor errors resulting from alpha particles and the leakage of current between the trenches by the scaling-down of the work make it difficult to form the conventional trench-type capacitor. On the other hand, the stack-type capacitor is manufactured by stacking a capacitor upon a silicon substrate, which makes it much less susceptible to minor errors due to a small diffusion region, and is relatively simple to manufacture. However, due to the structure of the capacitor stacked upon a transistor, the stack-type capacitor has a severe step coverage problem and has difficulties in growing a dielectric film.

When applying the above described three-dimensional capacitor cell structures to UVLSI memory devices below the order of a half-micron region, a stack-type capacitor or a combined stack-trench type capacitor having a large capacitor substrate topography has been proposed. The conventional manufacturing processes for the combined stack-trench type capacitor are illustrated in FIGS. 1A to 1E, and will be described below in detail.

FIG. 1A illustrates a process for forming a transistor and a trench 6 on a semiconductor substrate 100. At first, an active region is defined by depositing a field oxide layer 101 on the semiconductor substrate 100. A gate electrode 1, a source region 2 and a drain region 3 of a transistor which is an element of a memory cell are formed on the active region, and a first conductive layer 4, e.g., an impurity-doped first polycrystalline silicon layer, is formed on any predetermined portion of the field oxide layer 101 such that it is connected to a gate electrode of a memory cell disposed adjacently to the field oxide layer. An insulating layer 5, e.g., HTO (High Temperature Oxide) layer having a thickness of about 1500–1800 Å, is formed on the whole surface of the aforesaid structure. An opening is formed to expose a portion of the source region by applying a mask on the insulating layer formed on the source region, so that a trench 6 is formed by using the insulating layer in which the opening is formed.

FIG. 1B illustrates a process for forming a second conductive layer 7 serving as a first electrode of the capacitor, wherein the second conductive layer 7, e.g., an impurity-doped second polycrystalline silicon layer, is formed both on the inside of the trench 6 and on the insulating layer 5 by means of a low pressure chemical vapor deposition (LPCVD) device, to have a thickness of about 1000–2000 Å.

FIG. 1C illustrates a process for forming a photoresist pattern PR. As shown in FIG. 1C, the photoresist pattern PR is formed by conventional lithography such as by photoresist coating, mask exposure and development. During the process, the photoresist extends to the inside region of the trench 6, which is formed to be deep and narrow.

FIG. 1D illustrates a process for forming a first electrode pattern 7a of the capacitor, in which the pattern 7a is formed by etching the second conductive layer 7 with the application of the photoresist pattern PR as a mask.

FIG. 1E illustrates a process for removing the photoresist pattern. After the process illustrated in FIG. 1E is performed, a dielectric film and a third conductive layer are formed on the first electrode pattern 7a in succession, thereby completing the manufacturing of the combined stack-trench capacitor.

In the conventional method for manufacturing the combined stack-trench type capacitor described above, after the second conductive layer serving as the first electrode of the capacitor is formed, the first electrode pattern is formed through photoetching. During the forming of the first electrode pattern, the deep and narrow inside region of the trench is covered with the photoresist of the photoresist pattern. Therefore, when removing the photoresist pattern after the first electrode pattern is formed by applying the photoresist pattern, the photoresist is not completely removed but adheres onto the second conductive layer formed on the inside walls of the trench, so that it is difficult to uniformly form a dielectric film. Further, when the capacitor is formed by depositing the third conductive layer on the non-uniform dielectric film, the reliability and electrical characteristics of the capacitor are negatively affected.

SUMMARY OF THE INVENTION

Therefore, it is an object of the present invention to provide a method for manufacturing a capacitor, in which, to solve the above described problems of the conventional techniques, a second conductive layer is not exposed during the lithography process, when a first electrode pattern of the capacitor is formed after the second conductive layer has been deposited both on the inside of a trench and on a transistor.

To achieve the above mentioned object, a method for manufacturing a semiconductor device including a combined stack-trench type capacitor according to the present invention comprises: a first process of forming a conductive layer serving as a first electrode of the capacitor both on the inside of a trench and on a transistor, and of forming a planarizing layer to planarize the inner portion of the trench, a second process of forming a photoresist pattern on the planarizing layer in order to form an electrode pattern on the conductive layer, a third process of etching the planarizing layer by using the photoresist pattern, a fourth process of etching the conductive layer after performing the third process, a fifth process of removing the photoresist pattern, and a sixth process of removing the planarizing layer.

BRIEF DESCRIPTION OF THE DRAWINGS

The present invention will be described by way of an embodiment with reference to the attached drawings, in which.

DETAILED DESCRIPTION OF THE PREFERRED EMBODIMENT

Figure 1A:
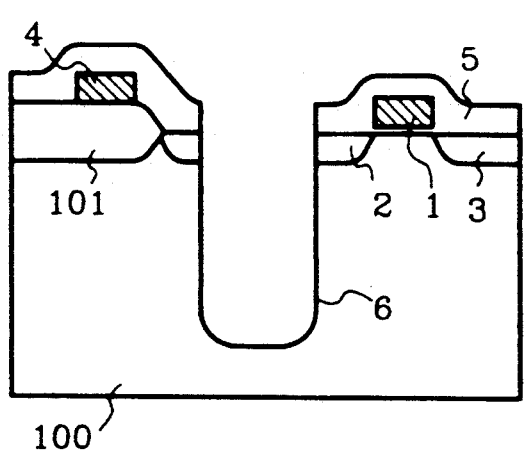
FIGS. 1A to 1E illustrate conventional manufacturing processes for the combined stack-trench type capacitor.
Figure 1B:
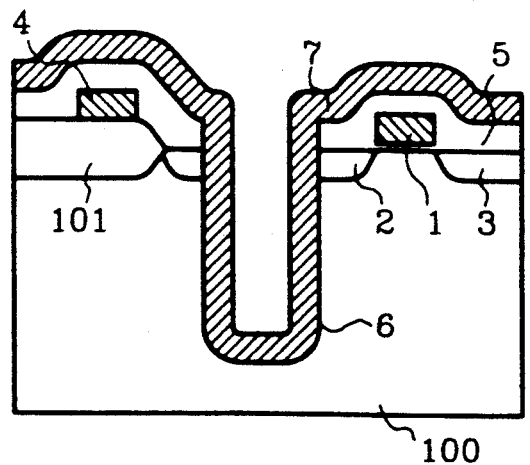
Figure 1C:
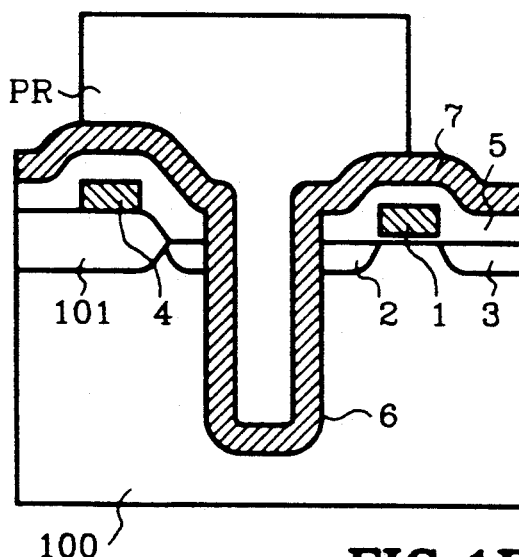
Figure 1D:
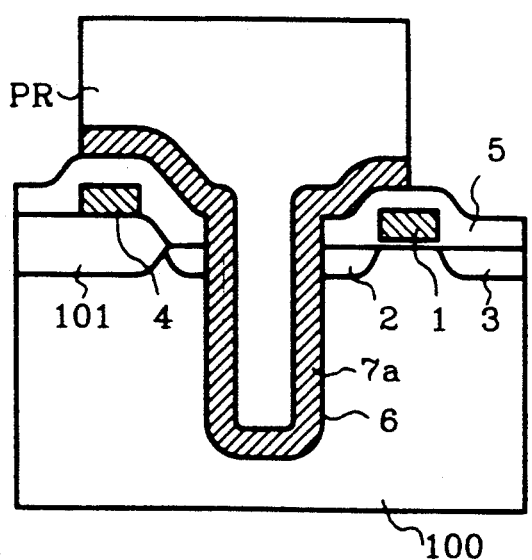
Figure 1E:
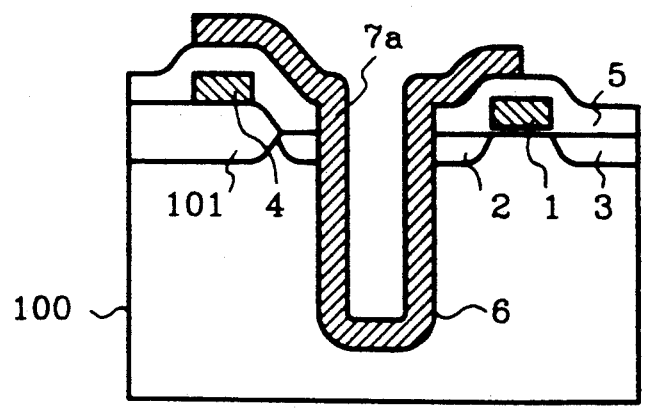
Figure 2A:
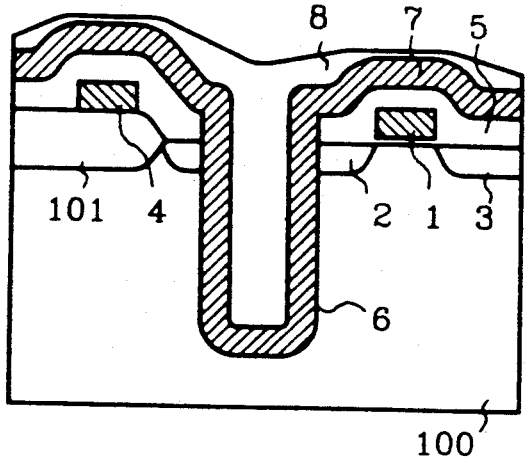
FIGS. 2A to 2F illustrate one embodiment of the manufacturing processes for the combined stack-trench type capacitor according to the present invention.

The manufacturing processes preceding the process of FIG. 2A are identical to those described in relation to FIGS. 1A and 1B.

FIG. 2A illustrates a process for forming a planarizing layer 8. After performing the process illustrated in FIG. 1B, the inside region of the trench 6 is planarized by spin-coating the planarizing layer 8, e.g., SOG (Spin On Glass) layer.

Figure 2B:
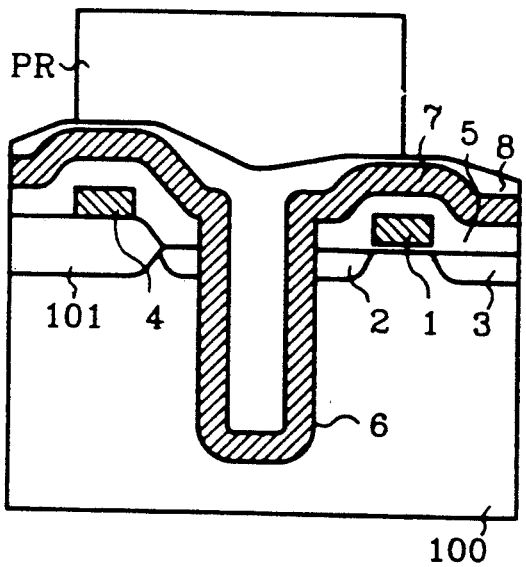

FIG. 2B illustrates a process for forming a photoresist pattern PR which is formed on the SOG layer through the process of photoresist coating, mask exposure and development. In this process, the photoresist pattern is prevented from contacting a second conductive layer formed on the inside of the trench, because of the SOG layer.

Figure 2C:
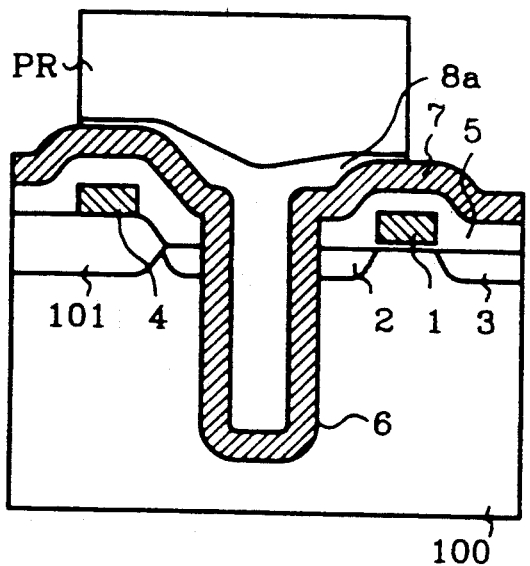

FIG. 2C illustrates the process for etching the SOG layer 8, wherein the portion of SOG layer, formed on the second conductive layer, which will not constitute a first electrode pattern of a capacitor, is etched via a dry etching process by applying the photoresist pattern PR. In this process, the SOG layer may be etched by a wet etching process.

Figure 2D:
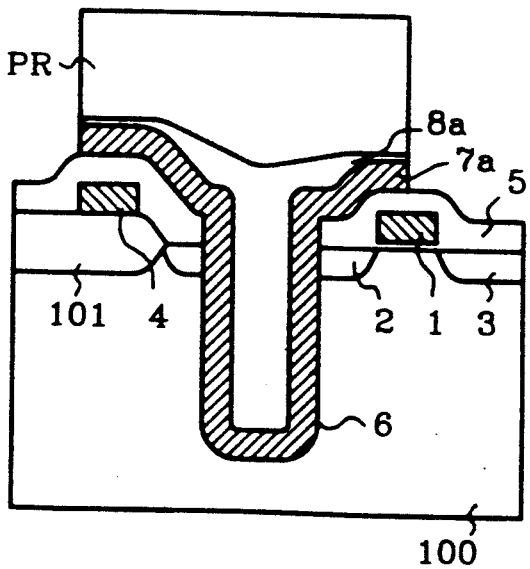

FIG. 2D illustrates the process for forming a first electrode pattern 7a of the capacitor, which is formed by etching the second conductive layer while applying the photoresist pattern PR and the defined SOG layer 8 as a mask.

Figure 2E:
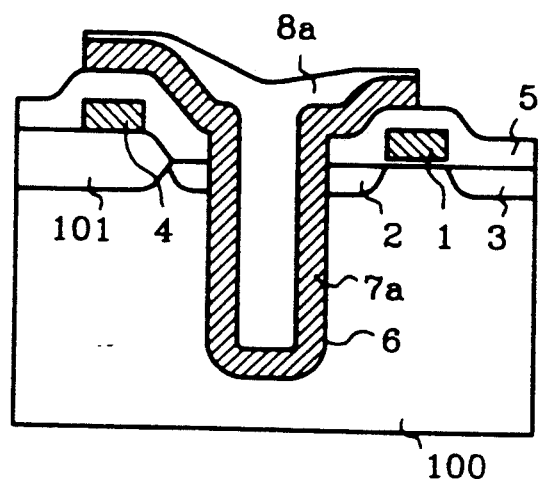

FIG. 2E illustrates the process for removing the photoresist pattern which has served as the mask during the formation of the first electrode pattern.

Figure 2F:
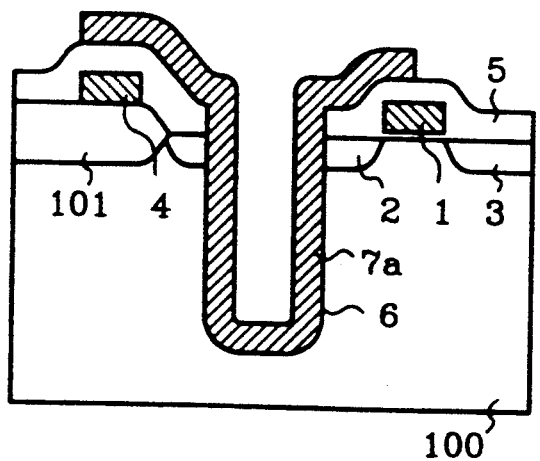

FIG. 2F illustrates the process for removing the planarizing layer shown in FIG. 2E. After performing the process shown in FIG. 2E, the SOG layer is removed by a wet etching process so that the formation of the first electrode pattern 7a of the capacitor, which does not contact the photoresist, is completed. After performing the process shown in FIG. 2F, a dielectric film and a third conductive layer are formed on the first electrode pattern 7a in succession, thereby completing the formation of the combined stack-trench type capacitor.

According to the present invention, in forming the first electrode pattern of a capacitor, a second conductive layer which functions as a first electrode of a capacitor is formed on both the inside of a trench and a transistor. After planarizing the second conductive layer by means of the planarizing layer disposed thereon, the first electrode pattern is formed by photoetching, so that the second conductive layer of the first electrode pattern can be prevented from contamination. Such contamination occurs in the conventional process due to the fact that, in the conventional process, the first electrode pattern is formed by the direct applying of the photoresist pattern on the second conductive layer, and the deep and narrow inner portion of the trench is filled with the photoresist of the photoresist pattern.

More specifically, in the present method, the planarizing layer is formed between the second conductive layer and the photoresist pattern in order to prevent exposing the first electrode pattern of the capacitor and to obviate the difficulties in removing the photoresist from the trench during the photoetching. This planarizing layer assures that a uniform dielectric film of good quality can be obtained by preventing the first electrode pattern from contamination as a result of the photoresist. Therefore, the improvement of the reliability and the electrical characteristics of the capacitor can be achieved.

What is claimed is:

1. A method for manufacturing a semiconductor device having a combined stack-trench type capacitor comprising the steps of:

forming a conductive layer serving as a first electrode of the capacitor both on the inside of a trench and on a transistor, and forming a planarizing layer to planarize the inside of said trench;

forming a photoresist pattern on said planarizing layer in order to form an electrode pattern of said conductive layer;

etching said planarizing layer by using said photoresist pattern;

etching said conductive layer after etching said planarizing layer;

removing said photoresist pattern;

and removing said planarizing layer.

2. A method for manufacturing a semiconductor device as claimed in claim 1, wherein said conductive layer is made of an impurity-doped polycrystalline material.

3. A method for manufacturing a semiconductor device as claimed in claim 1, wherein said planarizing layer is formed by spin-coating a SOG layer.

4. A method for manufacturing a semiconductor device as claimed in claim 1, wherein said etching of the planarizing layer is performed by a dry etching process.

5. A method for manufacturing a semiconductor device as claimed in claim 1, wherein said etching of the planarizing layer is performed by a wet etching process.

6. A method for manufacturing a semiconductor device as claimed in claim 1, wherein said removing of the photoresist pattern is performed by a wet etching process.

* * * * *